(12) United States Patent
Su et al.

(10) Patent No.: US 8,890,405 B2
(45) Date of Patent: Nov. 18, 2014

(54) ORGANIC LIGHT-EMITTING DEVICE AND IMAGE DISPLAY SYSTEM EMPLOYING THE SAME

(71) Applicant: InnoLux Corporation, Miao-Li County (TW)

(72) Inventors: Tsung-Yi Su, Miao-Li County (TW); Du-Zen Peng, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 13/918,241

(22) Filed: Jun. 14, 2013

(65) Prior Publication Data

US 2013/0335680 A1  Dec. 19, 2013

(30) Foreign Application Priority Data

Jun. 15, 2012  (TW) .............................. 101121471 A (51) Int. Cl.
| | | |
|---|---|---|
| *H01J 1/62* | (2006.01) | |
| *H01J 63/04* | (2006.01) | |
| *H01L 51/52* | (2006.01) | |
| *H01L 51/50* | (2006.01) | |
| *H01L 27/32* | (2006.01) | |
| *G02F 1/1335* | (2006.01) | |

(52) U.S. Cl.
CPC ............ *H01L 51/52* (2013.01); *H01L 51/5281* (2013.01); *H01L 51/5036* (2013.01); *H01L 27/3213* (2013.01); *G02F 1/1336* (2013.01)

USPC ........................................... 313/504; 313/512

(58) Field of Classification Search
CPC . G02F 1/13336; H01L 51/52; H01L 51/5036; H01L 51/5281; H01L 27/3213
USPC ........ 313/504, 512, 112; 428/690; 257/89, 98
See application file for complete search history.

(56) References Cited

U.S. PATENT DOCUMENTS

| | | | | |
|---|---|---|---|---|
| 7,956,528 | B2 * | 6/2011 | Nabeta ......................... | 313/504 |
| 2004/0186001 | A1 * | 9/2004 | Seto et al. ...................... | 501/70 |
| 2005/0046321 | A1 * | 3/2005 | Suga et al. .................... | 313/112 |
| 2007/0077349 | A1 * | 4/2007 | Newman et al. ................ | 427/66 |
| 2008/0286542 | A1 * | 11/2008 | Hayes et al. ................... | 428/213 |
| 2009/0256470 | A1 * | 10/2009 | Naono .......................... | 313/504 |
| 2011/0216271 | A1 * | 9/2011 | Suzuki et al. ................... | 349/71 |
| 2011/0267330 | A1 * | 11/2011 | Yamazaki et al. ............. | 345/211 |
| 2012/0038267 | A1 * | 2/2012 | Hanamura et al. ............ | 313/504 |
| 2013/0020934 | A1 * | 1/2013 | Iwasaki et al. ................ | 313/504 |
| 2013/0082589 | A1 * | 4/2013 | So et al. ........................ | 313/504 |
| 2013/0160938 | A1 * | 6/2013 | Yasui et al. ................... | 156/246 |

* cited by examiner

*Primary Examiner* — Nimeshkumar Patel
*Assistant Examiner* — Glenn Zimmerman
(74) *Attorney, Agent, or Firm* — Muncy, Geissler, Olds & Lowe, P.C.

(57) ABSTRACT

An organic light-emitting device and an image display system employing the same are provided. The organic light-emitting device includes: a first substrate; an organic light-emitting pixel structure disposed on a top surface of the first substrate; a second substrate having a bottom surface opposite to the top surface of the first substrate; and an optical functional layer disposed over the organic light-emitting pixel structure.

4 Claims, 9 Drawing Sheets

ORGANIC LIGHT-EMITTING DEVICE AND IMAGE DISPLAY SYSTEM EMPLOYING THE SAME

CROSS REFERENCE TO RELATED APPLICATIONS

This application is based upon and claims the benefit of priority from the prior Taiwan Patent Application No. 101121471, filed on Jun. 15, 2012, the entire contents of which are incorporated herein by reference.

BACKGROUND

1. Technical Field

The present invention relates to an organic light-emitting device and an image display system employing the same, and in particular, relates to an organic light-emitting device with high light extraction efficiency and an image display system employing the same.

2. Description of the Related Art

Recently, with the development and wide application of electronic products, such as mobile phones, PDAs, and notebook computers, there has been increasing demand for flat display elements which consume less electric power and occupy less space. Organic light-emitting devices are self-emitting and highly luminous, with wide viewing angles, fast response speeds, and simple fabrication methods, making them the best selection of the next generation flat panel display.

An organic light-emitting device is an LED that uses an organic layer as the active layer. In recent years, organic light-emitting devices have been gradually applied in flat panel displays. One trend in organic light-emitting device technology is to achieve high luminescent efficiency and long operating lifetimes.

Figure 1:
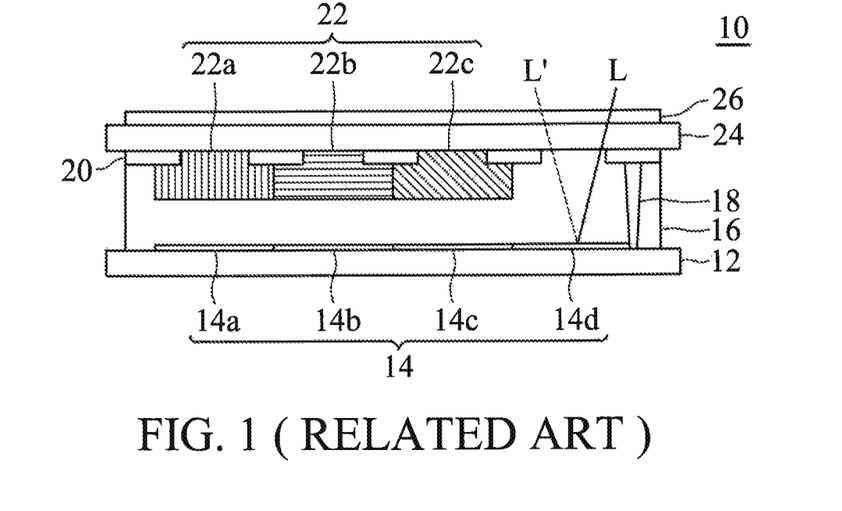
FIG. 1 is a schematic cross section of a conventional organic light-emitting device having a polarizing film.

As shown in FIG. 1, a conventional organic light-emitting device 10 includes a bottom substrate 12, organic light-emitting pixel structure 14 (including sub-pixels 14a-14d), a filling layer 16, a spacers 18, a black matrix 20, a color filter layer 22 (including red, blue, and green color filter layers), and a top substrate 24. In the conventional organic light-emitting device 10, since the organic light-emitting pixel structure 14 has a metal electrode (with high reflectivity) serving as an anode, a polarizing film 26 is further formed on the top substrate 24 in order to reduce the intensity of reflected light L' produced from the ambient incident light L, enhance the contrast of the image display system, and increase the usefulness for outdoor use.

At the present time, due to the poor transmittance (40~45%) of the polarizing film, the polarizing film 26 reduces the brightness of light produced from the organic light-emitting pixel structure 14 when shielding the ambient light, thereby reducing the light extraction efficiency and electroluminescent efficiency of the image display system 10 simultaneously. Hence, the driving voltage of the image display system 10 is increased for maintaining the brightness, resulting in reduced operating lifetime.

Accordingly, a novel organic light-emitting device having high light extraction efficiency which overcomes the above difficulties and inconveniences is desired.

SUMMARY

An exemplary embodiment of the disclosure provides a system for displaying images including an organic light-emitting device. The organic light-emitting device includes: a first substrate; an organic light-emitting pixel structure disposed on a top surface of the first substrate; a second substrate, having a bottom surface opposite to the top surface of the first substrate; and an optical functional layer disposed over the organic light-emitting pixel structure, wherein the optical functional layer has a transmittance of visible light of more than 50%, and a transmittance of ultraviolet light of less than 20%.

Another exemplary embodiment of the invention provides an image display system, including: the aforementioned organic light-emitting device; and an input unit coupled to the organic light-emitting device, wherein the input unit provides input to the organic light-emitting device such that the organic light-emitting device displays images.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The disclosure provides an organic light-emitting device and an image display system including the same, wherein the organic light-emitting device includes an optical functional layer to substitute for the conventional polarizing film.

Since the optical functional layer has a transmittance of visible light of more than 50%, the organic light-emitting device can have improved light extraction efficiency. Further, since the optical functional layer has a transmittance of ultraviolet light of less than 20%, the optical functional layer can shield the ultraviolet light of ambient light, resulting in the prevention of degradation, by ultraviolet light, of the organic material of the organic light-emitting device.

The following description is of the best-contemplated mode of carrying out the invention. This description is made for the purpose of illustrating the general principles of the invention and should not be taken in a limiting sense. The scope of the invention is best determined by reference to the appended claims.

Figure 2:
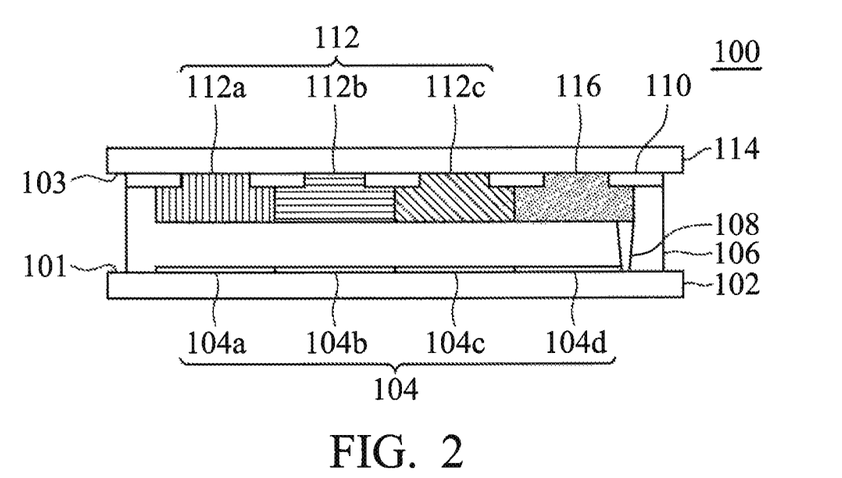
FIG. 2 is a schematic cross section of an organic light-emitting device according to an embodiment of the disclosure.
Figure 3:
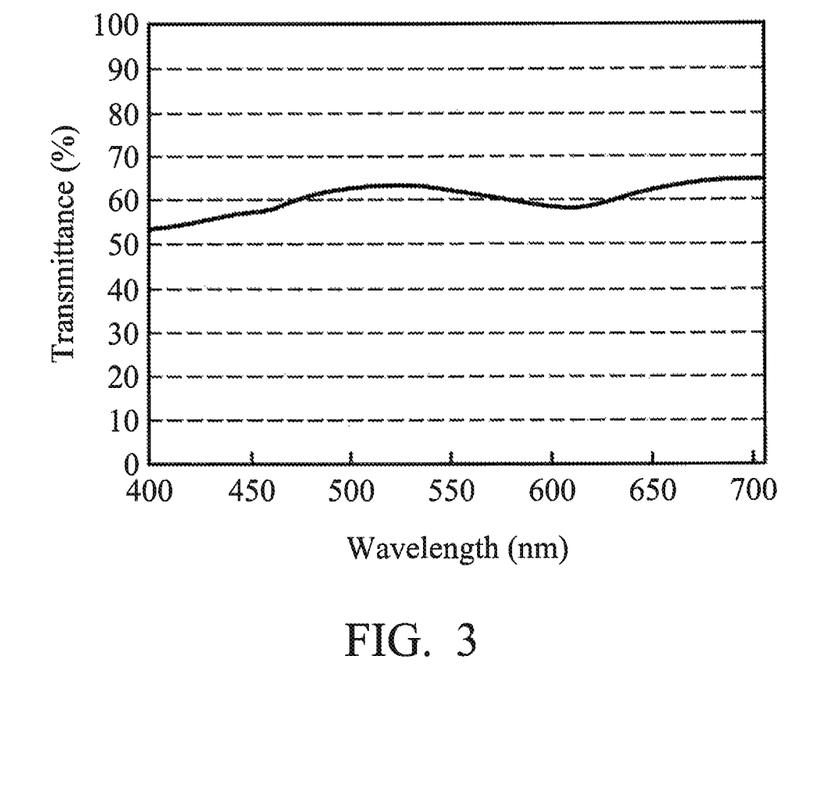
FIG. 3 shows a graph plotting transmittance against wavelength of the optical functional layer according to an embodiment of the disclosure.

As shown in FIG. 2, the organic light-emitting device 100 according to an embodiment of the disclosure has a first substrate 102, wherein the first substrate 102 can be a quartz substrate, a glass substrate, a ceramic substrate, a plastic substrate, or a substrate having active elements (such as thin film transistor). A second substrate 114 is opposite to the first substrate 102, and a plurality of black matrix 110 alternately disposed on the bottom surface 103 of the second substrate 114. Herein, the first substrate 102 can be a carrier substrate, the second substrate 114 can be a package substrate, and an organic light-emitting pixel structure 104 is disposed on the top surface 101 of the first substrate 102. A color filter layer 112 is disposed below the bottom surface 103 of the second substrate 114, and a spacer 108 is disposed between the first substrate 102 and second substrate to maintain a predetermined distance therebetween. According to an embodiment of the disclosure, the organic light-emitting pixel structure 104 can include a red sub-pixel 104a, a green sub-pixel 104b, a blue sub-pixel 104c, and a white sub-pixel 104d, wherein the red sub-pixel 104a, the green sub-pixel 104b, and the blue sub-pixel 104c correspond to a red filter layer 112a, green filter layer 112b, and a blue filter layer 112c for converting the white light produced from the red sub-pixel 104a, the green sub-pixel 104b, and the blue sub-pixel 104c respectively to red, green, and blue lights via the color filter layer 112. A filling layer 106 is disposed between the organic light-emitting pixel structure 104 and the color filter layer 112. It should be noted that a patterned optical functional layer 116 is disposed on the filling layer 106 over the white sub-pixel 104d to correspond to the white sub-pixel 104d, as shown in FIG. 2. The optical functional layer 116 of the disclosure can be a photoresist-like organic material (free of inorganic particles), such as photoresist material having vinylamine groups. The optical functional layer 116 has a transmittance of visible light (400-700 nm) of more than 50% (such as of between 50-70%, 50-80%, or 50-90%) for improving the light extraction efficiency of the organic light-emitting device. Further, the optical functional layer has a transmittance of ultraviolet light (230-400 nm) of less than 20% (such as less than 15%, or less than 10%) for preventing degradation, by ultraviolet light of the ambient light, of the organic material of the organic light-emitting device. For example, according to an embodiment of the disclosure, the method for forming the optical functional layer 116 includes the following steps. First, a composition (manufactured and sold by Echem Solutions Co, Ltd, (ECSC) with trade no, CT-9200, including a compound (represented by wherein R is H, or alkyl group) dissolved in an organic solvent) is coated on a substrate and then patterned. FIG. 3 shows a graph plotting transmittance against wavelength (of the visible light) of the optical functional layer 116 of the disclosure. In comparison with the polarizing film of the conventional organic light-emitting device, the optical functional layer 116 of the disclosure has a higher transmittance of visible light, since the optical functional layer 116 reduces the intensity of ambient light by means of absorption rather than polarization.

Further, due to the higher transmittance, the optical functional layer 116 improves the light extraction efficiency of the organic light-emitting device. Moreover, since the optical functional layer of the disclosure is made completely of organic material (without inorganic particles), the optical functional layer can be further patterned via photographic exposure and development processes, thereby being selectively formed on the specific sub-pixels. For example, as shown in FIG. 2, the patterned optical functional layer 116 can be disposed over the white sub-pixel 104d. Particularly, the optical functional layer 116 can be coplanar with the color filter layer 112, for reducing the interference of the ambient light. In the conventional organic light-emitting device, the polarizing film 26 covers all of the surface on the top substrate 24, and the light emitted by the red, blue and green sub-pixels has to pass through the polarizing film 26, resulting in a reduction in electroluminescent efficiency. In the disclosure, since the optical functional layer 116 can be further patterned and only disposed on the white sub-pixel 104d, the light emitted by the red, blue and green sub-pixel 104a-c does not pass through the optical functional layer 116, thereby enhancing the contrast of the organic light-emitting device. The optical functional layer 116 of the disclosure can have a thickness which keeps the transmittance of visible light to more than 50%. For example, the optical functional layer 116 has a thickness of between 100 nm-10 μm.

Figure 4:
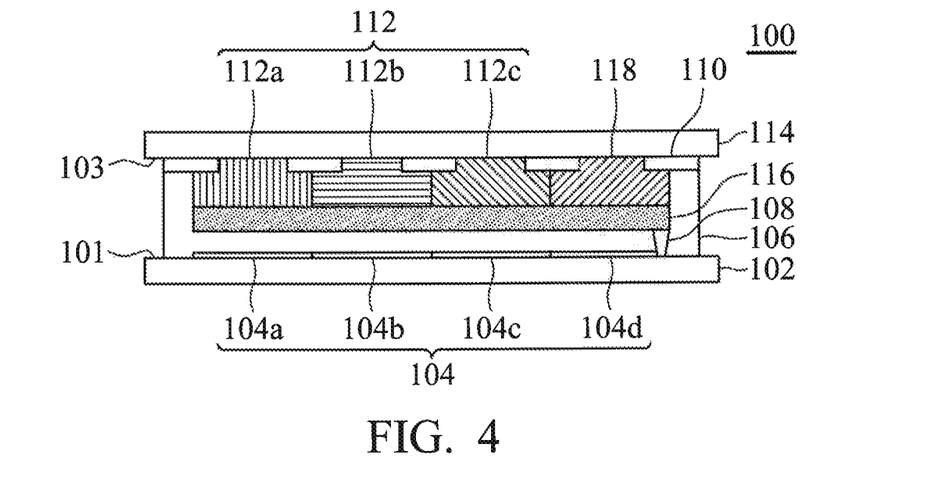
FIGS. 4-13 are schematic cross sections of organic light-emitting devices according to some embodiments of the disclosure.
Figure 5:
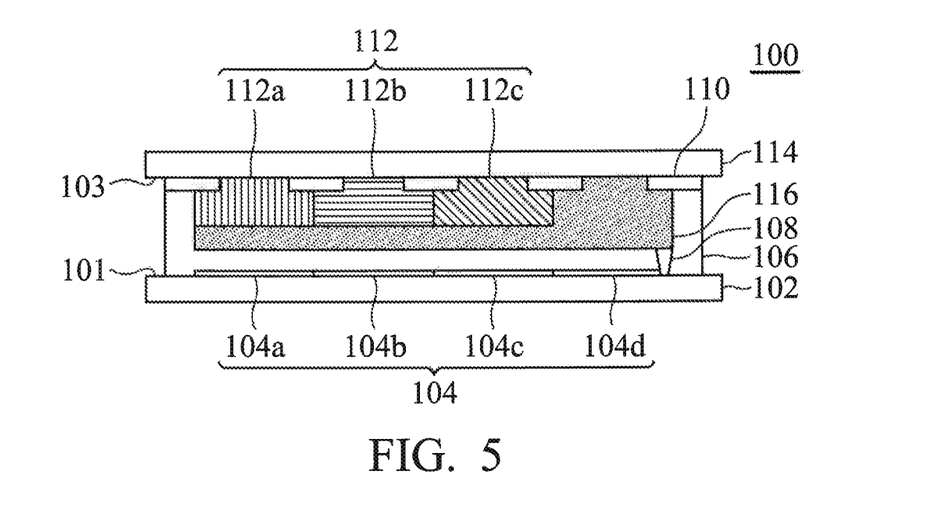
Figure 6:
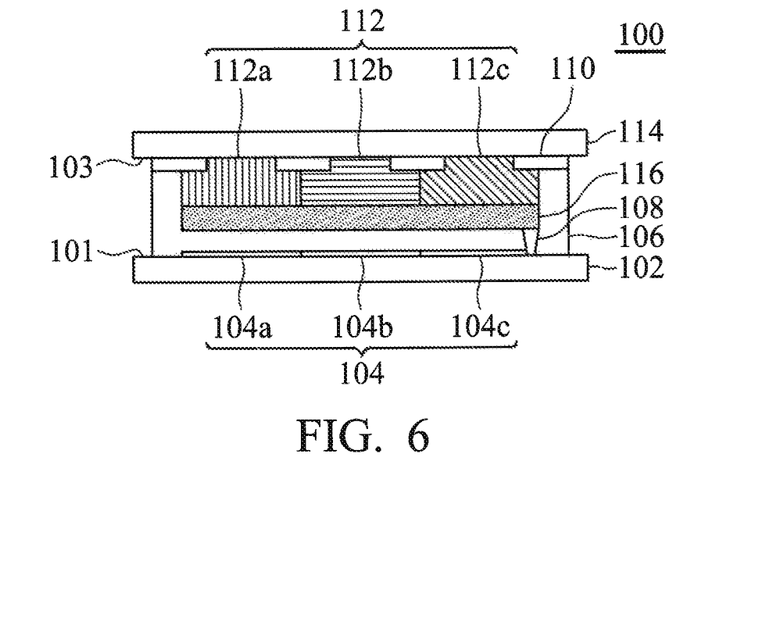

According to another embodiment of the disclosure, as shown in FIG. 4, the organic light-emitting device 100 can include a continuous optical functional layer 116 (i.e. a non-patterned optical functional layer) disposed between the color filter layer 112 and the filling layer 106, wherein a planarization layer 118 disposed on the bottom surface 103 of the second substrate 114, and the planarization layer 118 and the color filter layer 112 are coplanar in order to facilitate the formation of the optical functional layer 116. Further, as shown in FIG. 5, since the optical functional layer 116 is made completely of an organic material, the optical functional layer 116 can be formed on the color filter layer 112 by coating, filling the gap between the color filter layers 112. Therefore, the formation of the planarization layer can be omitted. Moreover, according to another embodiment of the disclosure, the optical functional layer 116 can not only be applied in the RGBW organic light-emitting device but also a RGB organic light-emitting device 100, as shown in FIG. 6.

It should be noted that, when the RGBW organic light-emitting device 100 employs a continuous optical functional layer 116, the organic light-emitting device 100 can have a higher transmittance of red, green, or blue light, resulting in the organic light-emitting pixel structure 104 to emit a light close to the standard white color temperature.

Figure 15:
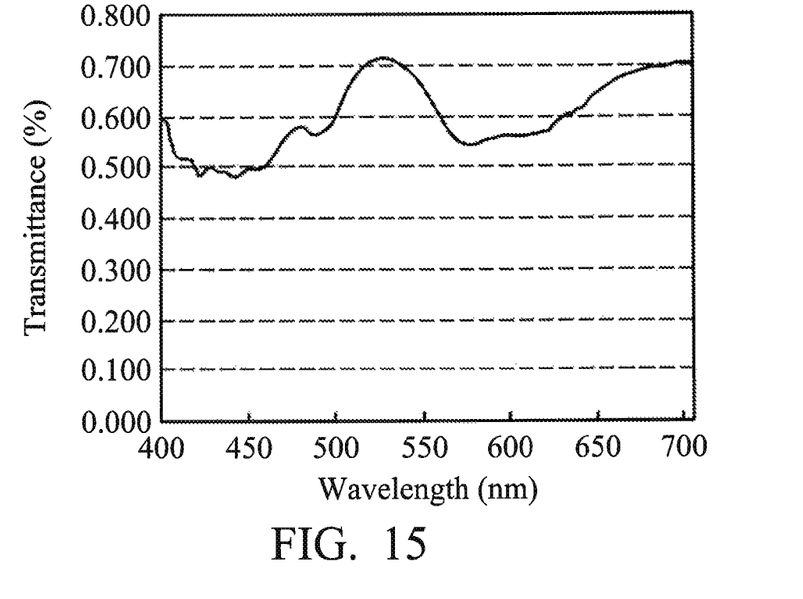
FIGS. 15 and 16 show graphs plotting transmittance against wavelength of the optical functional layer according to embodiments of the disclosure.
Figure 16:
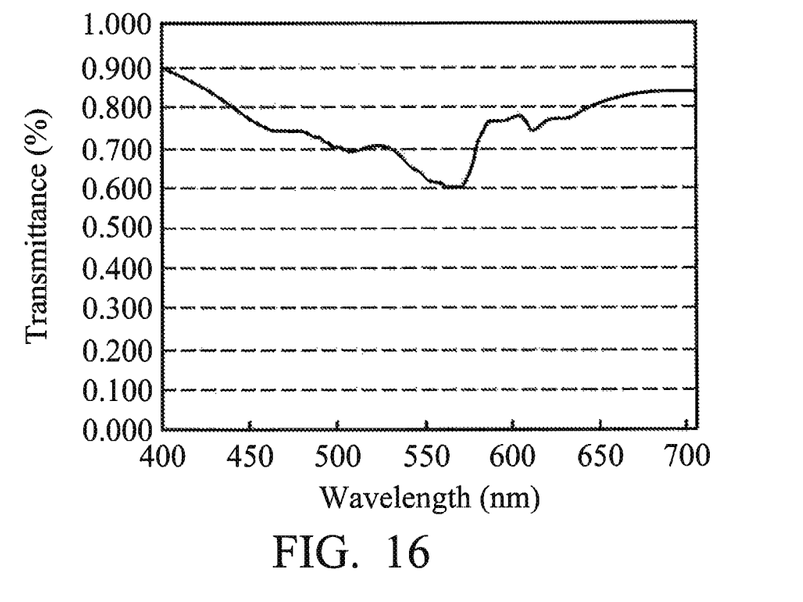

For example, if the organic light-emitting pixel structure 104 emits a white light with a relatively low intensity of red visible wavelength, an optical functional layer having a relatively high transmittance in the red visible wavelength would be employed by the organic light-emitting device to achieve standard white emission. If the organic light-emitting pixel structure 104 emits a white light with a relatively low intensity of green visible wavelength, an optical functional layer having a relatively high transmittance in the green visible wavelength (as shown in FIG. 15) would be employed by the organic light-emitting device to achieve standard white emission; and if the organic light-emitting pixel structure 104 emits a white light with a relatively low intensity of blue visible wavelength, an optical functional layer having a relatively high transmittance in the blue visible wavelength (as shown in FIG. 16) would be employed by the organic light-emitting device to achieve standard white emission. Therefore, the color shift problem of the organic light-emitting pixel structure 104 can be solved by means of the organic light-emitting pixel structure 104 of the disclosure.

Figure 7:
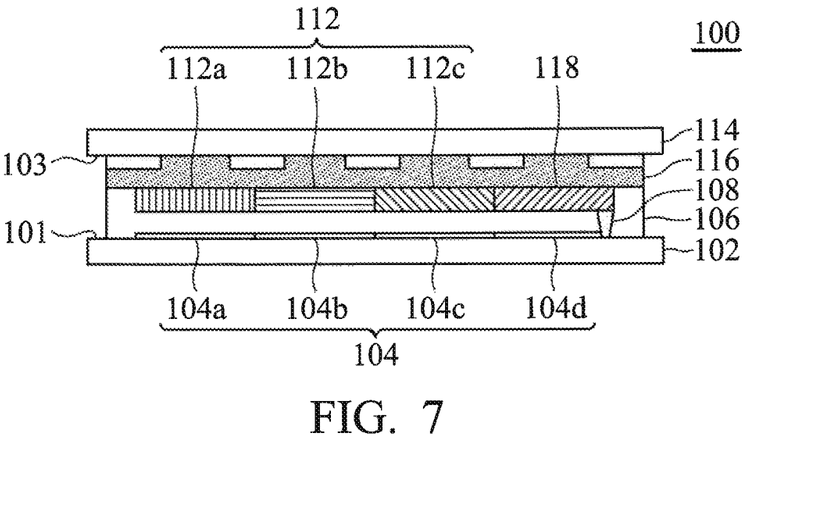
Figure 8:
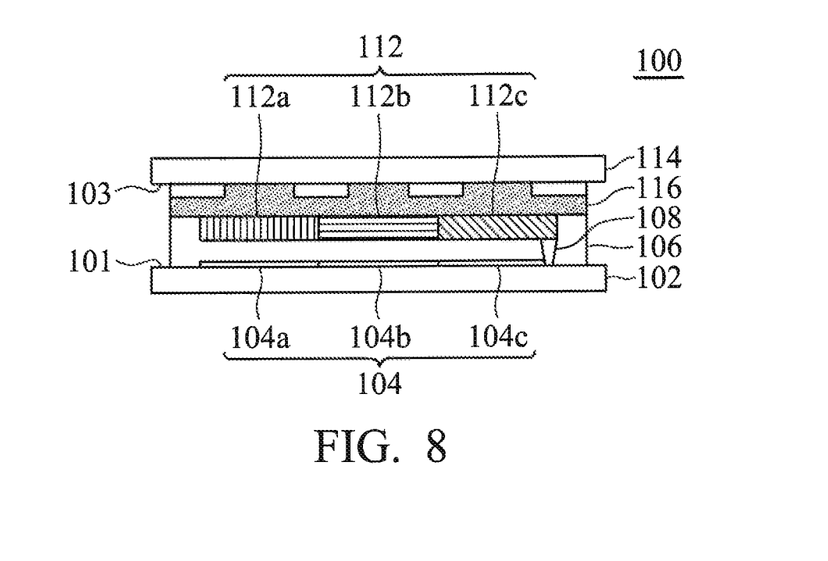

According to another embodiment of the disclosure, as shown in FIG. 7, the continuous optical functional layer 116 can be disposed between the bottom surface 103 of the second substrate 114 and the color filter layer 112, thereby preventing the alteration of the distance between the organic light-emitting pixel structure 104 and the color filter layer 112. As a result, the viewing angle of design rule can be maintained, and the light leakage can be prevented. According to other embodiments, the continuous optical functional layer 116 disposed between the bottom surface 103 of the second substrate 114 and the color filter layer 112 can be also applied in the RGB organic light-emitting device 100, as shown in FIG. 8.

Figure 9:
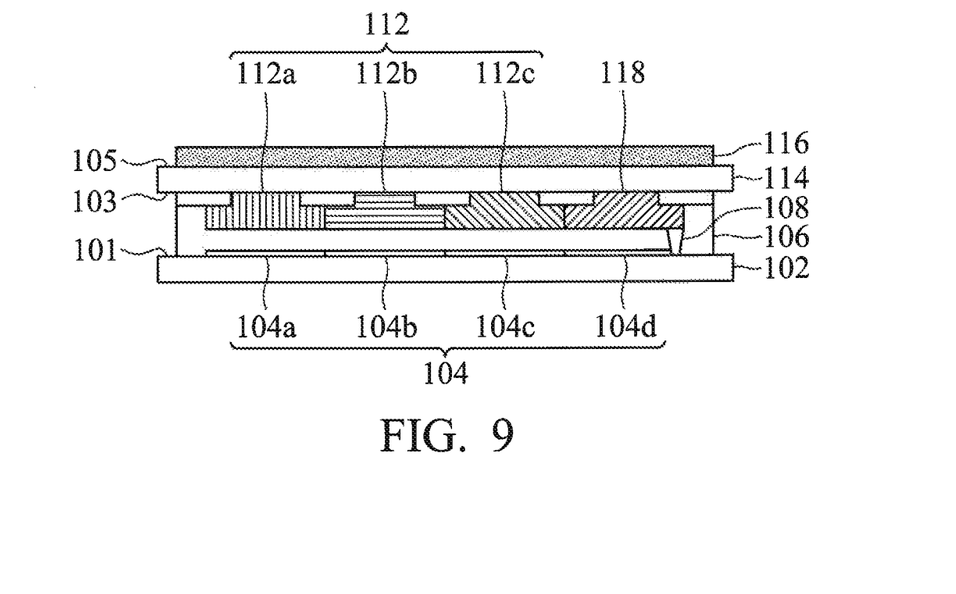

According to some embodiments of the disclosure, the continuous optical functional layer 116 can be disposed on the top surface 105 of the second substrate 114. Namely, the continuous optical functional layer 116 can be formed on the outside of the space between the first substrate 102 and second substrate 114, as shown in FIG. 9. The optical functional layer 116 can be formed in advance, and then be bonded on the top surface 105 of the second substrate 114 via an adhesive layer. Further, the optical functional layer 116 can be formed on the top surface 105 of the second substrate 114 by coating. Therefore, the process complexity of the organic light-emitting device 100 can be reduced.

Figure 10:
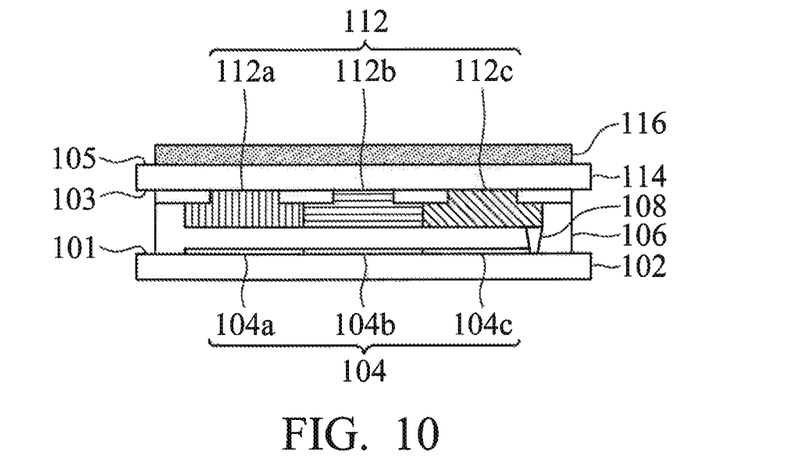

According to another embodiment of the disclosure, the continuous optical functional layer 116 formed on the second substrate 114 can also be applied in a RGB organic light-emitting device 100, as shown in FIG. 10.

Figure 11:
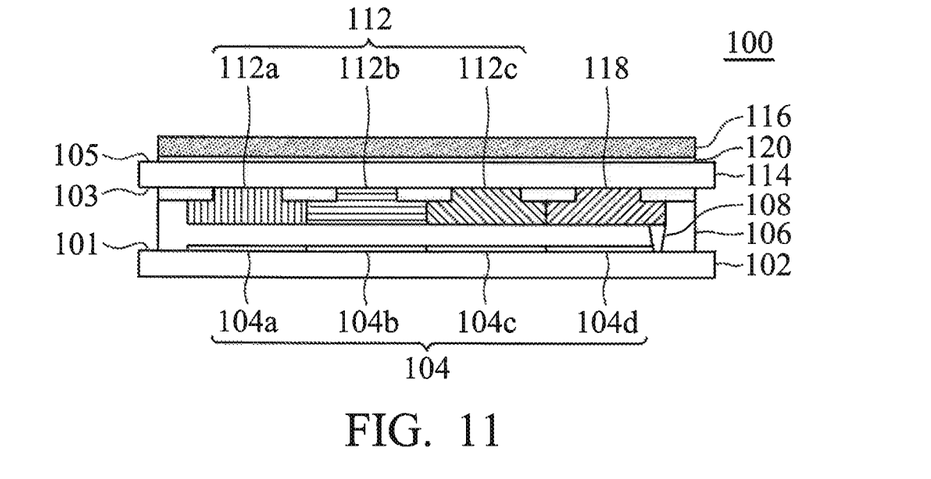

According to another embodiment of the disclosure, the organic light-emitting device 100 can further include a touch-sensitive layer 120 in combination with the optical functional layer 116, thereby achieving touch control function, as shown in FIG. 11. The touch-sensitive layer 120 can be a patterned transparent conductive layer. The accompanying drawings show the touch-sensitive layer 120 in a plain rectangle in order to simplify the illustration.

Figure 12:
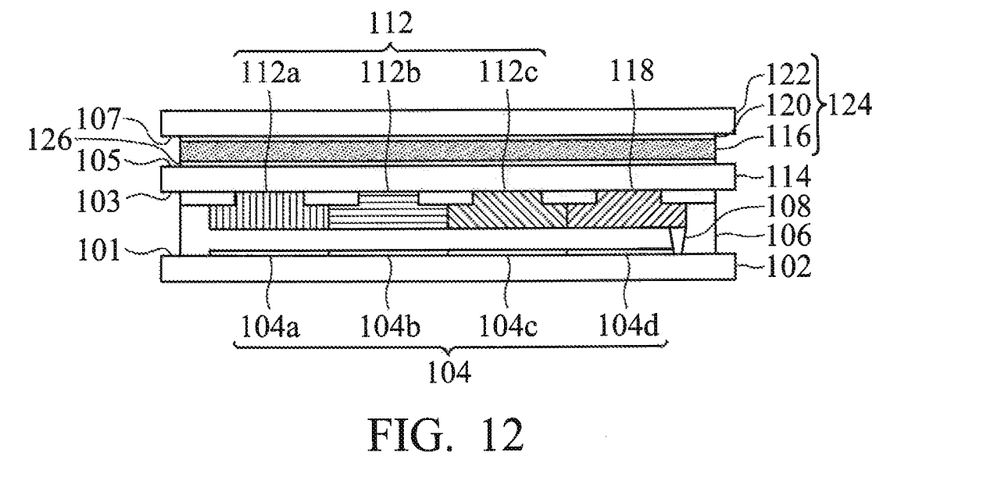
Figure 13:
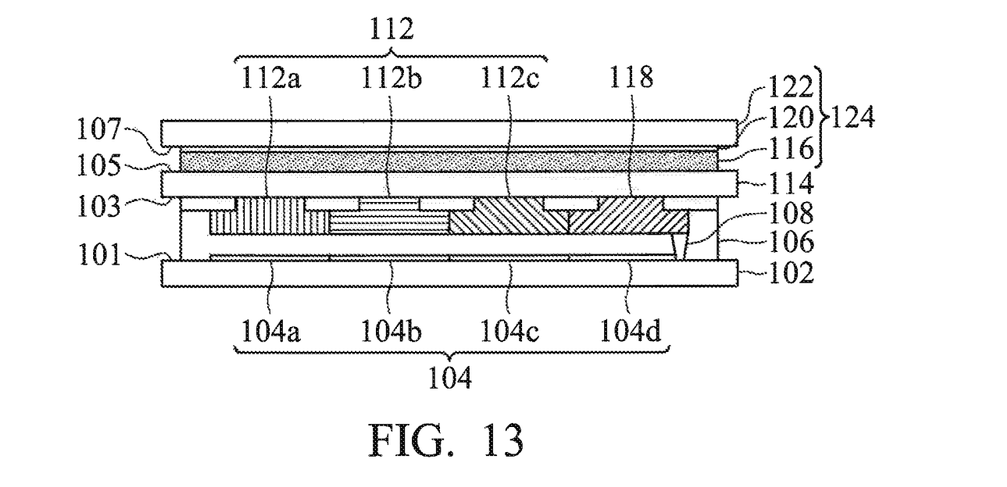
Figure 14:
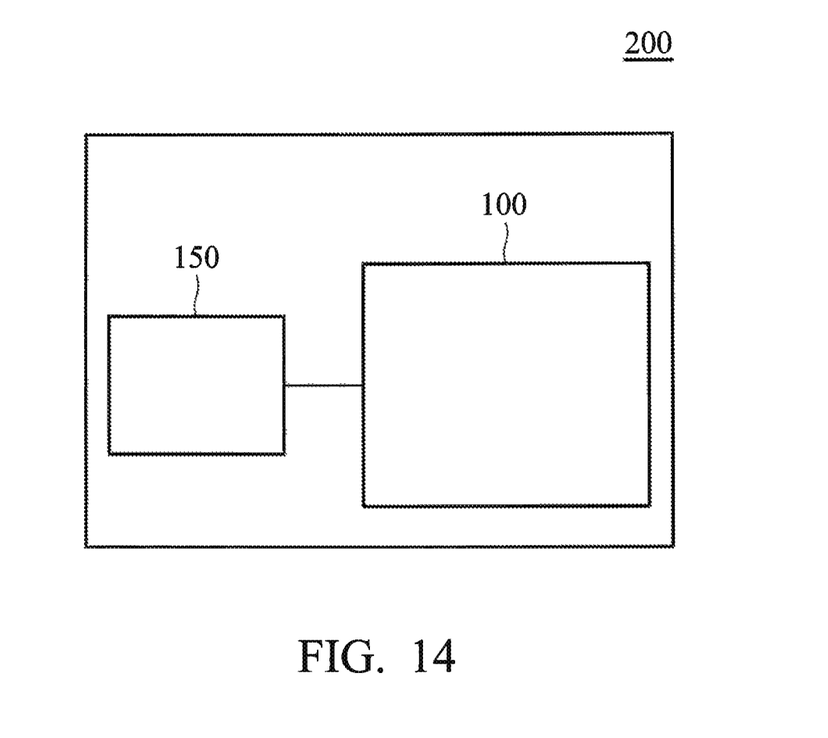
FIG. 14 schematically shows an image display system including the organic light-emitting device according to an embodiment of the disclosure.

According to some embodiments of the disclosure, the touch-sensitive layer 120 can be formed on a third substrate 122, and then the optical functional layer 116 can be formed on the optical functional layer, wherein the touch-sensitive layer 120, the third substrate 122, and the optical functional layer 116 comprise a touch panel 124. Next, the touch panel 124 can be bonded on the top surface 105 of the second substrate 114 via an adhesive layer 126, obtaining an organic light-emitting device 100 with touch control function, as shown in FIG. 12. Further, the touch panel 124 can be bonded with the second substrate 114 by means of the optical functional layer 116 serving as an adhesive layer, as shown in FIG. 13. Particularly, the composition for forming the optical functional layer 116 can further include an adhesive agent for increasing the adhesivity thereof As shown in FIG. 14, an image display system 200 including the organic light-emitting device 100 according to an embodiment of the disclosure is shown. The image display system 200 can be an electric device such as notebook computer, mobile phone, digital camera, personal data assistant (PDA), desktop computer, television, car display, or portable DVD player. The image display system 200 of the disclosure includes the organic light-emitting device 100 and an input unit 150 coupled to the organic light-emitting device 100. The input unit 150 is operative to provide input to the organic light-emitting device 100, such that the organic light-emitting device 100 displays images.

Accordingly, the organic light-emitting device of the disclosure replaces the polarizing film with the optical functional layer. Since the optical functional layer has a transmittance of visible light of more than 50%, the light extraction efficiency of the organic light-emitting device is enhanced. Further, the optical functional layer has a transmittance of ultraviolet light of less than 20%, thereby preventing the organic light-emitting device from degradation due to ambient light. Moreover, since the optical functional layer of the disclosure can be made completely of organic material, the optical functional layer can be patterned via photographic exposure and development processes, improving the contrast of the organic light-emitting device. Moreover, when the continuous optical functional layer 116 is applied in the RGBW organic light-emitting device 100, the organic light-emitting device can emit a light more close to the standard white color temperature by means of the optical functional layer having a relatively high transmittance in a specific wavelength range (such red visible wavelength, green visible wavelength, or blue visible wavelength).

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic light-emitting device, comprising:
a first substrate;
an organic light-emitting pixel structure disposed on a top surface of the first substrate, wherein the organic light-emitting pixel structure comprises a red sub-pixel, a green sub-pixel, a blue sub-pixel, and a white sub-pixel;
a filling layer disposed on the organic light-emitting pixel structure;
a color filter layer disposed on the filling layer;
a second substrate disposed over the color filter layer, having a bottom surface opposite to the top surface of the first substrate; and
an optical functional layer, which is patterned, disposed on the filling layer over the white sub-pixel of the organic light-emitting pixel structure, wherein the optical functional layer has a transmittance of visible light of more than 50%, and a transmittance of ultraviolet light of less than 20%.

2. The organic light-emitting device as claimed in claim 1, wherein the optical functional layer and the color filter layer are coplanar.

3. An organic light-emitting device, comprising:
a first substrate;
an organic light-emitting pixel structure disposed on a top surface of the first substrate, wherein the organic light-emitting pixel structure comprises a red sub-pixel, a green sub-pixel, a blue sub-pixel, and a white sub-pixel;
a filling layer disposed on the organic light-emitting pixel structure;
a color filter layer disposed over the filling layer;
a second substrate disposed over the color filter layer, having a bottom surface opposite to the top surface of the first substrate;
an optical functional layer disposed between the color filter layer and the filling layer, wherein the optical functional layer has a transmittance of visible light of more than 50%, and a transmittance of ultraviolet light of less than 20%; and a planarization layer disposed between the bottom surface of the second substrate and the optical functional layer over the white sub-pixel.

4. An organic light-emitting device, comprising:

a first substrate;

an organic light-emitting pixel structure disposed on a top surface of the first substrate, wherein the organic light-emitting pixel structure comprises a red sub-pixel, a green sub-pixel, a blue sub-pixel, and a white sub-pixel;

a filling layer disposed on the organic light-emitting pixel structure;

a color filter layer disposed over the filling layer;

a second substrate disposed over the color filter layer, having a bottom surface opposite to the top surface of the first substrate; and an optical functional layer disposed between the color filter layer and the filling layer over the red sub-pixel, the green sub-pixel, and the blue sub-pixel, and disposed between the filling layer over the white sub-pixel and the white sub-pixel, wherein the optical functional layer has a transmittance of visible light of more than 50%, and a transmittance of ultraviolet light of less than 20%.

* * * * *